United States Patent [19]

Porter et al.

[11] Patent Number: 6,005,797
[45] Date of Patent: Dec. 21, 1999

[54] LATCH-UP PREVENTION FOR MEMORY CELLS

[75] Inventors: John D. Porter; William N. Thompson, both of Meridian, Id.

[73] Assignee: Micron Technology, Inc., Biose, Id.

[21] Appl. No.: 09/045,465

[22] Filed: Mar. 20, 1998

[51] Int. Cl.[6] .............. G11C 11/00; H01L 29/76
[52] U.S. Cl. ............... 365/156; 365/154; 257/370; 257/372
[58] Field of Search ........................ 365/154, 156; 257/369, 372, 377, 370, 371

[56] References Cited

U.S. PATENT DOCUMENTS

| | | | |
|---|---|---|---|
| 5,298,782 | 3/1994 | Sundaresan | 257/393 |
| 5,721,445 | 2/1998 | Singh et al. | 257/369 |
| 5,804,477 | 9/1998 | Lien | 438/210 |

*Primary Examiner*—Son Mai
*Attorney, Agent, or Firm*—Killworth, Gottman, Hagan & Schaeff, LLP

[57] ABSTRACT

An SRAM memory cell is provided having a pair of cross-coupled CMOS inverters. The sources of the pull-up transistors forming each of the CMOS inverters are coupled to $V_{cc}$ through parasitic resistance of the substrate in which each is formed. The source of the p-type pull-up transistor is therefore always at a potential less than or equal to the potential of the N-well such that the emitter-base junction of the parasitic PNP transistor cannot become forward biased and latch-up cannot occur.

21 Claims, 6 Drawing Sheets

LATCH-UP PREVENTION FOR MEMORY CELLS

BACKGROUND OF THE INVENTION

The present invention relates in general to a static random access memory (SRAM), and, more particularly, to an SRAM having improved latch-up characteristics.

RAM chips are well known in the art. An SRAM chip is conventionally structured in rows and columns of individual SRAM cells. A prior art six transistor CMOS SRAM cell 1 is shown schematically in FIG. 1. The SRAM cell 1 includes two n-type access transistors 5, 6, two p-type pull-up transistors 7, 8 acting as load devices, and two n-type pull-down transistors 9, 10, with the pull-transistors 7,8 and pull-down transistors 9, 10 forming two CMOS inverters. The SRAM cell 1 has two states: logic state "0" and logic state "1". By convention, if logic state "0" is designated by node A having a high voltage and node B having a low voltage, then logic state "1" has the opposite stored voltages, i.e., node A having a low voltage and node B having a high voltage.

In logic state "0" the high voltage on node A turns on the pull-down transistor 9 and turns off the pull-up transistor 7, whereas the low voltage on node B turns off the pull-down transistor 10 and turns on the pull-up transistor 8. Because the pull-down transistor 9 is on and the pull-up transistor 7 is off, current flows through the pull-down transistor 9 to a voltage supply $V_{SS}$ (ground), thereby maintaining a low voltage on node B. Because the pull-up transistor 8 is turned on and the pull-down transistor 10 is turned off, current flows from a voltage supply $V_{cc}$ through the pull-up transistor 8, thereby maintaining a high voltage on node A.

To change the state of the SRAM cell 1 from a logic "0" to a logic "1", a column line 3 and a column line complement 2 are provided with a low and a high voltage, respectively. Then, the access transistors 5 and 6 are turned on by a high voltage on a row line 4, thereby providing the low voltage on the column line 3 to node A and the high voltage on the column line complement 2 to node B. Accordingly, the pull-down transistor 9 is turned off and the pull-up transistor 7 is turned on by the low voltage on node A and the pull-down transistor 10 is turned on and the pull-up transistor 8 is turned off by the high voltage on node B, thereby switching the state of the circuit from logic "0" to logic "1". Following the switching of the state of the SRAM cell 1, the access transistors 5 and 6 are turned off (by applying a low voltage on row line 4). The SRAM cell 1 maintains its new logic state in a manner analogous to that described above.

FIGS. 2A and 2B are a schematic diagram and cross-section, respectively, of one of the CMOS inverters of FIG. 1 illustrating parasitic transistors and resistors of the inverter. As shown in FIG. 2B, the pull-down transistor 9 is formed within a P-type substrate 12 while the pull-up transistor 7 is formed within an N-well 14. The N-well 14 is formed within the P-type substrate 12. The N-well 14 includes parasitic resistance denoted by the resistor 16 and the P-type substrate includes parasitic resistance denoted by the resistor 18. The configuration of the pull-down transistor 9 and the pull-up transistor 7 results in the existence of a PNP parasitic bipolar transistor 20 and an NPN parasitic bipolar transistor 22.

With the tight layout spacings that exist in a typical memory array, leakage currents from the N-well 14 and the P-type substrate 12 are possible. These leakage currents produce a voltage drop across the parasitic resistor 16. If the voltage drop becomes sufficiently large, it can result in the parasitic PNP transistor 20 turning on and conducting current from the P+ region forming its emitter to the P-type substrate 12 that forms its collector. The P-type substrate 12 also forms the base terminal of the parasitic NPN transistor 22 and one terminal of the parasitic resistor 18. The other terminal of the parasitic resistor 18 is the substrate tie-down represented by $V_{BB}$. The current flowing through the resistor 18 produces a voltage rise at the point of injection. If this voltage rise becomes sufficiently large, it can result in the NPN transistor 22 turning on causing additional current to be drawn out the N-well 14 as collector current for the NPN transistor 22. This additional current reinforces the original leakage from the N-well 14 turning the PNP transistor 20 on even harder providing added base current for the NPN transistor 22. This feedback loop can result in a latch-up problem within the memory array containing the SRAM cell.

Accordingly, there is a need for an improved SRAM memory cell that is not prone to latch-up.

SUMMARY OF THE INVENTION

The present invention meets this need by providing an SRAM memory cell in which the source of the p-type pull-up transistor is coupled to $V_{cc}$ through the parasitic resistance of the N-well in which it is formed. The source of the p-type pull-up transistor is therefore always at a potential less than or equal to the potential of the N-well such that the emitter-base junction of the parasitic PNP transistor cannot become forward biased and latch-up cannot occur.

According to a first aspect of the present invention, an SRAM memory cell is provided comprising a first pull-up transistor having a first substrate, a first source, a first gate coupled to a first node, and a first drain coupled to a second node. The first source is coupled to a first voltage input through parasitic resistance of the first substrate. A first pull-down transistor is provided having a second drain coupled to the second node, a second gate coupled to the first node, and a second source coupled to a second voltage source. An input line is coupled to the first node for providing a signal to the memory cell to change the memory cell from a first logic state to a second logic state. The input line may comprise an access transistor having one terminal coupled to the first node, another terminal coupled to a column line, and an access gate coupled to a row line.

According to another aspect of the present invention, an SRAM memory cell is provided comprising a first pull-up transistor, a first pull down transistor, a second pull-up transistor, a second pull-down transistor, and an input line. The first pull-up transistor includes a first substrate, a first source, a first gate coupled to a first node, and a first drain coupled to a second node. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node. The second pull-down transistor includes a fourth drain coupled to the first node, a fourth gate coupled to the second node, and a fourth source coupled to the second voltage input. The first source is coupled to a first voltage input through parasitic resistance of the first substrate while the third source is coupled to the first voltage input through parasitic resistance of the second substrate. The input line is coupled to the first and second nodes for providing a signal to the memory cell to change the memory cell from a first logic state to a second logic state. Preferably, the first substrate and the second substrate are portions of a single substrate.

According to yet another aspect of the present invention, an SRAM memory cell is provided comprising a substrate assembly having at least one semiconductor layer, and a first semiconductor structure formed within the at least one semiconductor layer with the first semiconductor structure being coupled to a first voltage input. A first pull-up transistor is formed in the first semiconductor structure and comprises a first gate, a first source and a first drain. The first source is coupled to the first semiconductor structure such that the first source is coupled to the first voltage input through parasitic resistance of the semiconductor structure. A first pull-down transistor is formed in the at least one semiconductor layer and comprises a second gate coupled to the first gate, a second source coupled to a second voltage input, and a second drain coupled to the first drain.

The memory cell may further comprise an access transistor formed in the at least one semiconductor layer having one terminal coupled to the first and second drains, another terminal coupled to a column line and an access gate coupled to a row line. Preferably, the at least one semiconductor layer comprises P-type semiconductor material and the semiconductor structure comprises an N-type well.

According to a further aspect of the present invention, an SRAM memory cell comprises a substrate assembly having at least one semiconductor layer, and a first semiconductor structure and a second semiconductor structure formed within the at least one semiconductor layer with the first and second semiconductor structures being coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain.

Preferably, the at least one semiconductor layer comprises P-type semiconductor material while the first and second semiconductor structures each comprise an N-type well. The first semiconductor structure and the second semiconductor structure may form portions of a single semiconductor structure. The memory cell may further comprise a first access transistor formed in the at least one semiconductor layer having a first terminal coupled to the first and second drains, a second terminal coupled to a first column line and a first access gate coupled to a row line, and a second access transistor formed in the at least one semiconductor layer having a third terminal coupled to the third and fourth drains, a fourth terminal coupled to a second column line and a second access gate coupled to the row line.

According to a still further aspect of the present invention an SRAM memory array is provided comprises a plurality of memory cells arranged in rows and columns. Each of the memory cells comprise a first pull-up transistor, a first pull-down transistor, a second pull-up transistor, a second pull-down transistor, a first access transistor and a second access transistor. The first pull-up transistor includes a first substrate, a first source, a first gate coupled to a first node, and a first drain coupled to a second node with the first source being coupled to a first voltage input through parasitic resistance of the first substrate. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node with the third source being coupled to the first voltage input through parasitic resistance of the second substrate. The second pull-down transistor includes a fourth drain coupled to the first node, a fourth gate coupled to the second node, and a fourth source coupled to the second voltage input. The first access transistor includes a first terminal coupled to the first and second drains, a second terminal coupled to a first column line and a first access gate coupled to a row line. The second access transistor includes a third terminal coupled to the third and fourth drains, a fourth terminal coupled to a second column line and a second access gate coupled to the row line. The memory array also includes a memory decoder coupled to the plurality of memory cells for accessing each of the plurality of memory cells via the respective ones of a plurality of the row lines and respective ones of a plurality of the first and second column lines.

Preferably, the first substrate and the second substrate form portions of a single substrate. The memory array may comprise a plurality of the rows with each of the first and second pull-up transistors making up each of the rows of memory cells sharing a common substrate.

According to yet another aspect of the present invention, an SRAM memory array is provided comprising a plurality of SRAM memory cells arranged in rows and columns and formed on a substrate assembly comprises at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines.

Preferably, the first substrate and the second substrate form portions of a single substrate. The at least one semiconductor layer may comprise P-type semiconductor material while the first semiconductor structure may comprise an N-type well. The memory array may comprise a plurality of the rows with each of the first and second pull-up transistors making up each of the rows of memory cells sharing the N-type well.

According to yet another aspect of the present invention, a computer system is provided comprising an SRAM memory array and a microprocessor. The memory array comprises a plurality of memory cells arranged in rows and columns with each of the memory cells comprising a first pull-up transistor, a first pull-down transistor, a second pull-up transistor, a second pull-down transistor, a first access transistor and a second access transistor. The first pull-up transistor includes a first substrate, a first source, a first gate coupled to a first node, and a first drain coupled to a second node with the first source being coupled to a first voltage input through parasitic resistance of the first substrate. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node with the third source being coupled to the first voltage input through parasitic resistance of the second substrate. The second pull-down transistor includes a fourth drain coupled to the first node, a fourth gate coupled to the second node, and a fourth source coupled to the second voltage input. The first access transistor includes a first terminal coupled to the first and second drains, a second terminal coupled to a first column line and a first access gate coupled to a row line. The second access transistor includes a third terminal coupled to the third and fourth drains, a fourth terminal coupled to a second column line and a second access gate coupled to the row line. The memory array also includes a memory decoder coupled to the plurality of memory cells for accessing each of the plurality of memory cells via the respective ones of a plurality of the row lines and respective ones of a plurality of the first and second column lines. The microprocessor communicates with each of the plurality of memory cells via the memory decoder.

According to a further aspect of the present invention, a computer system is provided comprising a SRAM memory array and a microprocessor. The memory array comprises a plurality of memory cells arranged in rows and columns and formed on a substrate assembly comprises at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines. The microprocessor communicates with each of the plurality of memory cells via the memory decoder.

According to a still further aspect of the present invention, a method of fabricating an SRAM memory cell is provided. A substrate assembly having at least one semiconductor layer is provided. A first semiconductor structure is formed within the at least one semiconductor layer. A first source and a first drain of a first pull-up transistor are formed in the first semiconductor structure. A second source and a second drain of a first pull-down transistor are formed in the at least one semiconductor layer. A first contact and a second contact are formed within the first semiconductor structure. A first gate for the first pull-up transistor and a second gate for the first pull-down transistor are formed. The first drain is coupled to the second drain and the first gate is coupled to the second gate. The first source is coupled to one of the first and second contacts such that with the other of the first and second contacts coupled to a first voltage input the first source is coupled to the first voltage input through parasitic resistance of the first semiconductor structure.

According to another aspect of the present invention, a method of fabricating an SRAM memory cell is provided. A substrate assembly having at least one semiconductor layer is provided. A first semiconductor structure and a second semiconductor structure are formed within the at least one semiconductor layer. A first source and a first drain of a first pull-up transistor are formed in the first semiconductor structure. A second source and a second drain of a first pull-down transistor are formed in the at least one semiconductor layer. A third source and a third drain of a second pull-up transistor are formed in the second semiconductor structure. A fourth source and a fourth drain of a second pull-down transistor are formed in the at least one semiconductor layer. A first contact and a second contact are formed within the first semiconductor structure. A third contact and fourth contact are formed within the second semiconductor structure. A first gate for the first pull-up transistor, a second gate for the first pull-down transistor, a third gate for the second pull-up transistor and a fourth gate for the second pull-down transistor are formed. The first drain is coupled to the second drain and the third drain is coupled to the fourth drain. The first gate is coupled to the second gate and the third gate is coupled to the fourth gate. The first source is coupled to one of the first and second contacts such that with the other of the first and second contacts coupled to a first voltage input the first source is coupled to the first voltage input through parasitic resistance of the first semiconductor structure. The third source is coupled to one of the third and fourth contacts such that with the other of the third and fourth contacts coupled to the first voltage input the third source is coupled to the first voltage input through parasitic resistance of the second semiconductor structure.

Preferably, the first substrate and the second substrate form portions of a single substrate. The at least one semiconductor layer may comprise P-type semiconductor material while the first semiconductor structure may comprise an N-type well.

According to yet another aspect of the present invention, a method of fabricating an SRAM memory array is provided. A substrate assembly having at least one semiconductor layer is provided. A plurality of memory cells arranged in rows and columns are formed. Each of the plurality of memory cells are fabricated according to the following steps. A first semiconductor structure is formed within the at least one semiconductor layer. A second semiconductor structure is formed within the at least one semiconductor layer. A first source and a first drain of a first pull-up transistor are formed in the first semiconductor structure. A second source and a second drain of a first pull-down transistor are formed in the at least one semiconductor layer. A third source and a third drain of a second pull-up transistor are formed in the second semiconductor structure. A fourth source and a fourth drain of a second pull-down transistor are formed in the at least one semiconductor layer. A first terminal and a second terminal of a first access transistor are formed in the at least one semiconductor layer. A third terminal and a fourth terminal of a second access transistor are formed in the at least one semiconductor layer. A first contact and a second contact are formed within the first semiconductor structure. A third contact and fourth contact are formed within the second semiconductor structure. A first gate for the first pull-up transistor, a second gate for the first pull-down transistor, a third gate for the second pull-up transistor, a fourth gate for the second pull-down transistor, a first access gate for the first access transistor, and a second access gate for the second access transistor are formed. The first drain is coupled to the second drain and the third drain is coupled to the fourth drain. The first gate is coupled to the second gate and the third gate is coupled to the fourth gate. The first terminal is coupled to the first and second drains and the third terminal is coupled to the third and fourth drains. The first source is coupled to one of the first and second contacts such that with the other of the first and second contacts coupled to a first voltage input the first source is coupled to the first voltage input through parasitic resistance of the first semiconductor structure. The third source is coupled to one of the third and fourth contacts such that with the other of the third and fourth contacts coupled to the first voltage input the third source is coupled to the first voltage input through parasitic resistance of the second semiconductor structure. The first and second access gates of each of the plurality of memory cells are coupled to respective row lines. The second terminals of each of the plurality of memory cells are coupled to respective first column lines. The fourth terminals of each of the plurality of memory cells are coupled to respective second column lines.

Preferably, the first substrate and the second substrate form portions of a single substrate. Each of the first and second pull-up transistors making up each of the rows of memory cells may share the N-type well.

According to a still further aspect of the present invention, a method of fabricating a computer system is provided. A memory array and a microprocessor are provided. The memory array comprises a plurality of memory cells arranged in rows and columns and formed on a substrate assembly comprising at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines. The microprocessor communicates with each of the plurality of memory cells via the memory decoder.

Accordingly, it is an object of the present invention to provide an improved SRAM that is not prone to latch up; and, to provide an improved SRAM memory cell wherein parasitic resistance is used to couple $V_{cc}$ to pull-up transistors to prevent latch-up of the memory cell. Other features and advantages of the invention will be apparent from the following description, the accompanying drawings and the appended claims.

DETAILED DESCRIPTION OF THE PREFERRED EMBODIMENTS

Figure 1:
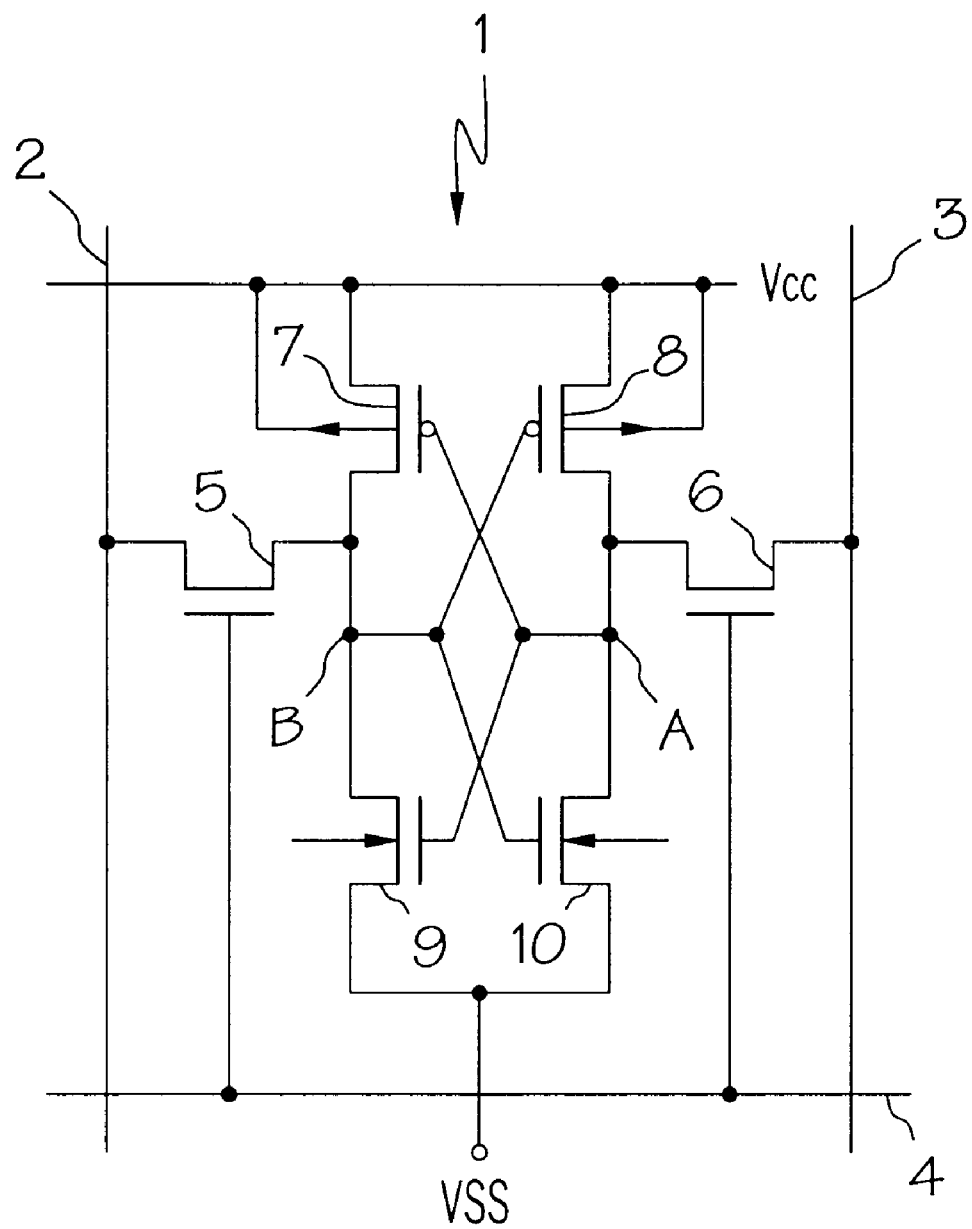
FIG. 1 illustrates a prior art six transistor SRAM memory cell.
Figure 2A:
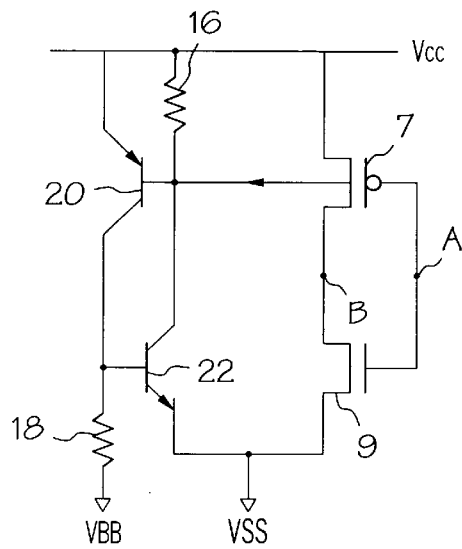
FIG. 2A illustrates one of the inverters of the SRAM memory cell of FIG. 1 along with the corresponding parasitic transistors and resistors.
Figure 2B:
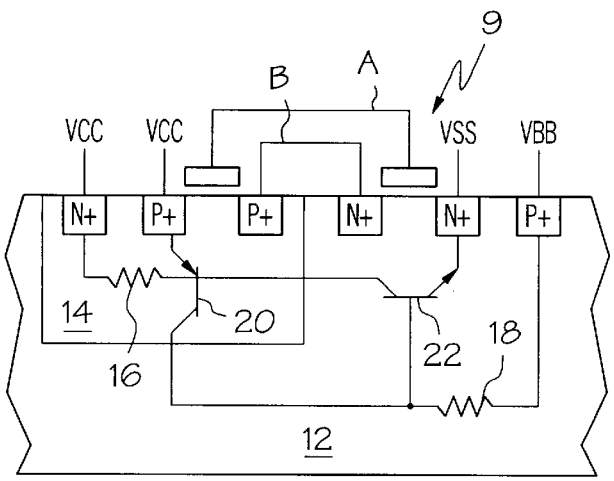
FIG. 2B is an enlarged, sectioned side view depicting the inverter and parasitic transistors and resistors of FIG. 2A.
Figure 3:
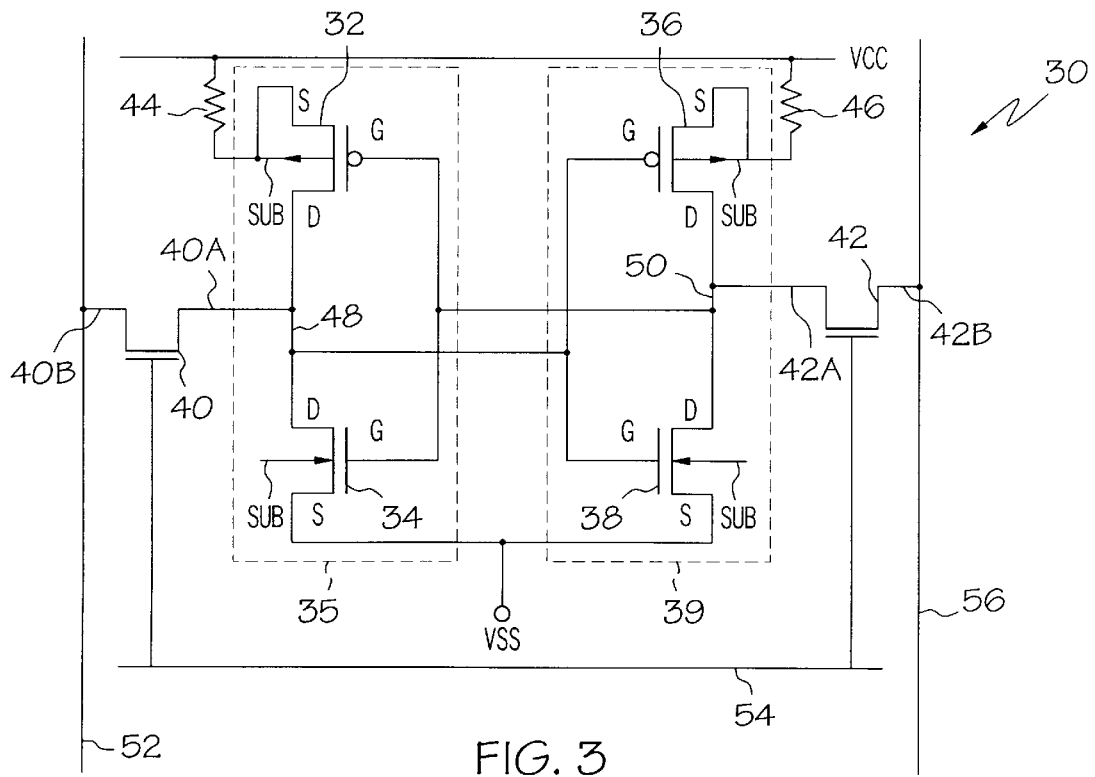
FIG. 3 illustrates schematically an SRAM memory cell in accordance with the present invention.

FIG. 3 illustrates schematically an SRAM memory cell 30 in accordance with the present invention. The SRAM memory cell 30 includes a first MOS (p-type) pull-up transistor 32, a first MOS (n-type) pull-down transistor 34, a second MOS (p-type) pull-up transistor 36, a second MOS (n-type) pull-down transistor 38, a third MOS or first access transistor 40 and a fourth MOS or second access transistor 42. The MOS transistors 32, 34, 36 and 38 each include a drain (D), a gate (G) and a source (S) as illustrated in FIG. 3 with the first pull-up transistor 32 having a first drain 32D, a first source 32S and a first gate 32G, the first pull-down transistor 34 having a second drain 34D, a second source 34S and a second gate 34G, the second pull-up transistor 36 having a third drain 36D, a third source 36S and a third gate 36G and the second pull-down transistor 38 having a fourth drain 38D, a fourth source 38S and a fourth gate 38G, see FIGS. 4A, 4B and 5.

It will be appreciated by those skilled in the art that the drain and source terminals of a MOS transistor are typically identical with the drain/source label being applied for descriptive purposes once a voltage is applied to the transistor. For n-type transistors, the drain designation is applied to the terminal having the higher voltage potential with the source designation being applied to the other terminal. Accordingly, separate drain/source designations have not been applied to the access transistors 40 and 42 as voltages across the drain/source terminals change in such a manner as to cause corresponding changes in drain/source designations for the access transistors 40 and 42. The drains and sources of the first and second access transistors 40 and 42 will be described as first terminals 40A, 42A and second terminals 40B, 42B for descriptive purposes herein.

Each of the MOS transistors 32, 34, 36 and 38 have substrate terminals SUB corresponding to the semiconductor substrates in which the transistors are formed. The substrates of the pull-up transistors 32 and 36 are coupled to a first voltage input $V_{CC}$. The sources 32S, 36S of the pull-up transistors 32 and 36 are coupled to their corresponding substrates such that the sources are coupled to the first voltage input $V_{cc}$ through the parasitic resistance of each substrate represented by resistors 44 and 46. The drains 32D, 36D of the pull-up transistors 32 and 36 are coupled to a first node 48 and a second node 50, respectively. The drains 34D, 38D of the pull-down transistors 34 and 38 are coupled to the first node 48 and the second node 50, respectively. The sources 34S, 38S of the pull-down transistors 34 and 38 are coupled to a second voltage input or $V_{ss}$. Typically, $V_{cc}$ is approximately 5.0 volts to 2.0 volts, depending on the process and technology, while $V_{ss}$ is approximately zero volts or ground.

The transistors 32, 34, 36 and 38 form a pair of cross-coupled CMOS inverters with transistors 32 and 34 config-ured as a first CMOS inverter 35 and transistors 36 and 38 configured as a second CMOS inverter 39. The pull-down transistors 34 and 38 are cross-coupled with the drain 34D of the first pull-down transistor 34 being coupled to the gate 38G of the second pull-down transistor 38 and the drain 38D of the second pull-down transistor 38 being coupled to the gate 34G of the first pull-down transistor 34. For illustrative purposes, it is assumed that logic state "0" is designated by node 48 having a low voltage and node 50 having a high voltage while logic state "1" is designated by node 48 having a high voltage and node 50 having a low voltage.

In logic state "0" the high voltage on node 50 turns on the first pull-down transistor 34 and turns off the first pull-up transistor 32, whereas the low voltage on node 48 turns off the second pull-down transistor 38 and turns on the second pull-up transistor 36. Because the first pull-down transistor 34 is on and the first pull-up transistor 32 is off, current flows through the first pull-down transistor 34 to the second voltage input $V_{ss}$, thereby maintaining a low voltage on node 48. Because the second pull-up transistor 36 is turned on and the second pull-down transistor 38 is turned off, current flows from the first voltage input $V_{cc}$ through the second pull-up transistor 36, thereby maintaining a high voltage on node 50. It should be apparent that for logic state "1," the on/off states of the transistors are reversed with corresponding current flows.

The first terminal 40A of the first access transistor 40 is coupled to the first node 48 while the second terminal 40B is coupled to a first bit or column line 52. The first access gate 40G of the first access transistor 40 is coupled to a word or row line 54. Similarly, the first terminal 42A of the second access transistor 42 is coupled to the second node 50 while the second terminal 42B is coupled to a second bit or column line 56. The second access gate 42G of the second access transistor 42 is coupled to the word or row line 54. Typically, the first and second column lines 52, 56 receive symmetrical data pulses with one of the column lines receiving the complement of the other column line. It should be apparent that the first and second access transistors 40 and 42 function as an input line for providing access to the memory cell 30.

To change the state of the SRAM cell 30 from a logic "0" to a logic "1", the second column line 56 and the first column line 52 are provided with a low and a high voltage, respectively. Then, the access transistors 40 and 42 are turned on by a high voltage on the row line 54, thereby providing the low voltage on the second column line 56 to node 50 and the high voltage on the first column line 52 to node 48. Accordingly, the first pull-down transistor 34 is turned off and the first pull-up transistor 32 is turned on by the low voltage on node 50, and the second pull-down transistor 38 is turned on and the second pull-up transistor 36 is turned off by the high voltage on node 48, thereby switching the state of the circuit from logic "0" to logic "1". Following the switching of the state of the SRAM cell 30, the access transistors 40 and 42 are turned off (by applying a low voltage on row line 54). The SRAM cell 30 maintains its new logic state in a manner analogous to that described above.

Figure 4A:
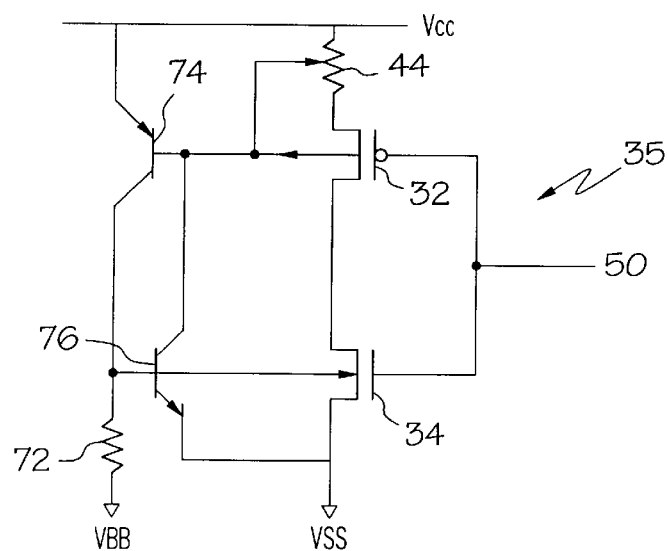
FIG. 4A illustrates one of the inverters of the SRAM memory cell of FIG. 3 along with the corresponding parasitic transistors and resistors.
Figure 4B:
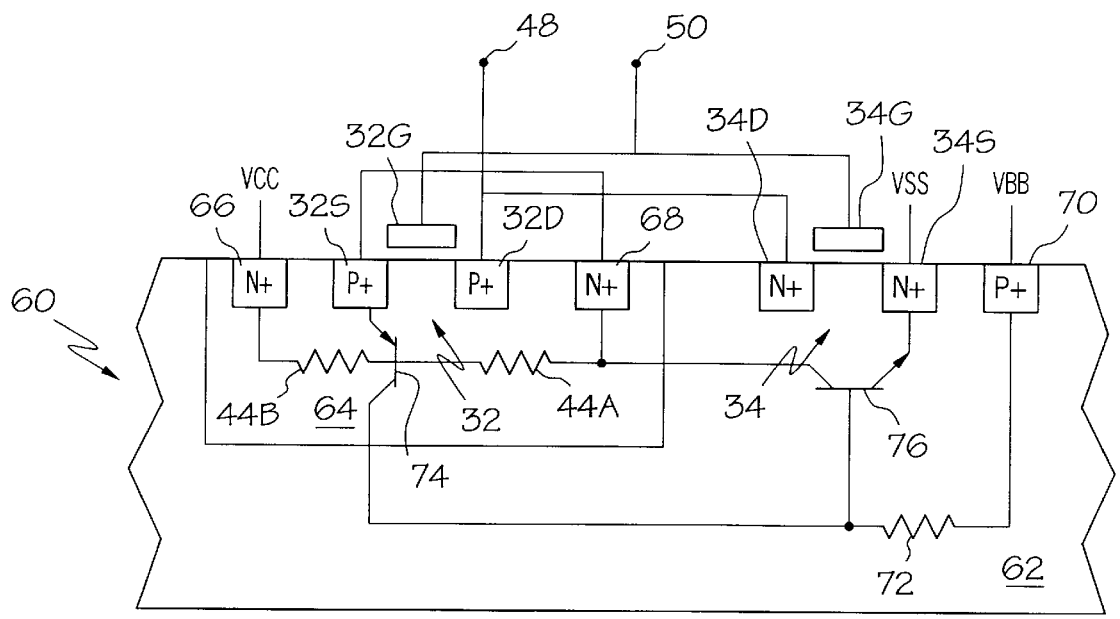
FIG. 4B is an enlarged, sectional side view depicting the inverter and parasitic transistors and resistors of FIG. 4A.

Referring now to FIGS. 4A and 4B, the effect of the parasitic devices resulting from the configuration of the SRAM cell 30 will now be described. A schematic diagram of the first CMOS inverter 35 is illustrated in FIG. 4A with its corresponding parasitic transistors and resistors. It will be appreciated by those skilled in the art that the second inverter 39 includes similar parasitic transistors and resistors. A cross-section of the first CMOS inverter 35 of FIG. 4A is illustrated in FIG. 4B. As shown in FIG. 4B, the first inverter 35, and hence, the memory cell 30, is formed on a substrate assembly 60 comprising a semiconductor layer 62 that is silicon in the illustrated embodiment, and may also include additional layers or structures that define active or operable portions of semiconductor devices (not shown). For example, the semiconductor layer 62 of the substrate assembly 60 may be formed on insulating material, sapphire or another base material.

The semiconductor layer 62 is doped with impurities to form a semiconductor of a first or p-type conductivity. A first semiconductor structure formed within the semiconductor layer 62 is preferably formed of a second or n-type conductivity commonly referred to as an N-well 64. The first pull-down transistor 34 is formed within the semiconductor layer 62 and the first pull-up transistor 32 is formed within the N-well 64.

Buried contacts are formed within the semiconductor layer 62 and the N-well 64 to form the second source 34S and the second drain 34D of the first pull-down transistor 34, and the first source 32S and the first drain 32D of the first pull-up transistor 32. A first contact 66 and a second contact 68 are also formed within the N-well 64 while a first tie-down contact 70 is formed in the semiconductor layer 62. The first gate 32G of the first pull-up transistor 32 and the second gate 34G of the first pull-down transistor 34 are also formed. It should be apparent that the N-well 64 and the semiconductor layer 62 represent the semiconductor substrates in which the transistors 32 and 34 are formed. The first contact 66 and the first tie-down contact 70 are thus used to bias the N-well/first pull-up transistor substrate 64 and the semiconductor layer/first pull-down transistor substrate 62, respectively. It will be appreciated by those skilled in the art that the N-well 64, the buried contacts, and the gates may be formed using processes well known in the art.

Appropriate electrically conductive interconnect layers are formed using processes well known in the art to couple the first gate 32G to the second gate 34G, the first drain 32D to the second drain 34D, and the first source 32S to the second contact 68. Additional electrically conductive interconnect layers are formed to couple the first contact 66 to the first voltage input $V_{cc}$, the second source 34S to the second voltage input $V_{ss}$, and the first tie-down contact 70 to the substrate 62 tie down $V_{BB}$. The N-well 64 includes parasitic resistance denoted by the resistors 44A and 44B while the substrate 62 includes parasitic resistance denoted by the resistor 72. The configuration of the first inverter 35 also results in the existence of a PNP parasitic bipolar transistor 74 and an NPN parasitic bipolar transistor 76.

The parasitic resistor 44 is shown as two resistors 44A and 44B to denote the parasitic resistance between the second contact 68 and the base of the parasitic PNP bipolar transistor 74 and the parasitic resistance between the base of the parasitic PNP bipolar transistor 74 and the first contact 66. The first source 32S is thus coupled to the first voltage input $V_{cc}$ through the combined parasitic resistance of the N-well 64 represented by the parasitic resistors 44A and 44B. The substrate connection of the first pull-up transistor 32 is shown as a variable resistor in FIG. 4A because the resultant parasitic resistance of the N-well 64 varies depending on the distance between the first contact 66 and the first source 32S, i.e., the further the separation the greater the resistance.

Leakage current from the N-well 64 produces a voltage drop across the parasitic resistor 44A. However, with the first source 32S coupled to the first voltage input $V_{cc}$ through the N-well 64, the first source 32S is always at a potential less than or equal to the potential of the N-well 64. The net result of this configuration is that the emitterbase junction of the parasitic PNP transistor 74 cannot become forward biased and latch-up cannot occur.

Figure 5:
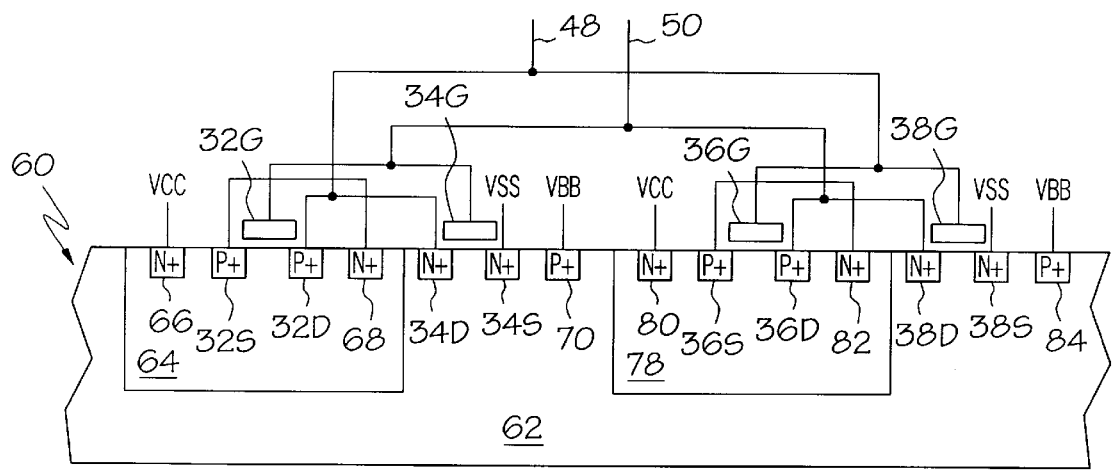
FIG. 5 is an enlarged, sectional side view of the SRAM memory cell of FIG. 3 according to one aspect of the present invention.

Referring now to FIG. 5, the cross-sectional layout of the SRAM memory cell 30 is shown without the parasitic resistors and transistors. The second pull-up transistor 36 is formed within a second semiconductor structure or N-well 78 while the second pull-down transistor 38 is formed within the semiconductor layer 62. Buried contacts are formed within the semiconductor layer 62 and the N-well 78 to form the fourth source 38S and the fourth drain 38D of the second pull-down transistor 38, and the third source 36S and the third drain 36D of the second pull-up transistor 36 using processes well known in the art. A third contact 80 and a fourth contact 82 are also formed within the N-well 78 while a second tie-down contact 84 is formed in the semiconductor layer 62 using processes well known in the art. The third gate 36G of the second pull-up transistor 36 and the fourth gate 38G of the second pull-down transistor 38 are formed using processes well known in the art. It should be apparent that the N-well 78 and the semiconductor layer 62 represent the semiconductor substrates in which the transistors 36 and 38 are formed, respectively. The third contact 80 and the second tie-down contact 84 are thus used to bias the N-well/second pull-up transistor substrate 78 and the semiconductor layer/first pull-down transistor substrate 62, respectively.

Appropriate electrically conductive interconnect layers are formed using processes well known in the art to couple the third gate 36G and the fourth gate 38G to the first drain 32D and the second drain 34D, the third drain 36D and the fourth drain 38D to the first gate 32G and the second gate 34G, and the third source 36S to the fourth contact 82. Additional electrically conductive interconnect layers are formed to coupled the third contact 80 to the first voltage input $V_{cc}$, the fourth source 38S to the second voltage input $V_{ss}$ and the second tie-down contact 84 to the substrate 62 tie down $V_{BB}$. It will be appreciated by those skilled in the art that the first and second pull-down transistors 34 and 38 may be arranged so that only one tie-down contact is needed for the memory cell 30. It will be further appreciated by those skilled in the art that a single N-well may be used to form the first and second pull-up transistors 32 and 36. It will be even further appreciated by those skilled in the art that the first and second pull-up transistors 32 and 36 may be configured to share the same source contact. Accordingly, with the first semiconductor structure or N-well 64 the same as the second semiconductor structure or N-well 78, i.e., forming portions of a single substrate, only one contact would be needed to couple the sources to the N-well and only one contact would be needed to couple the N-well to the first voltage input $V_{cc}$.

Figure 6:
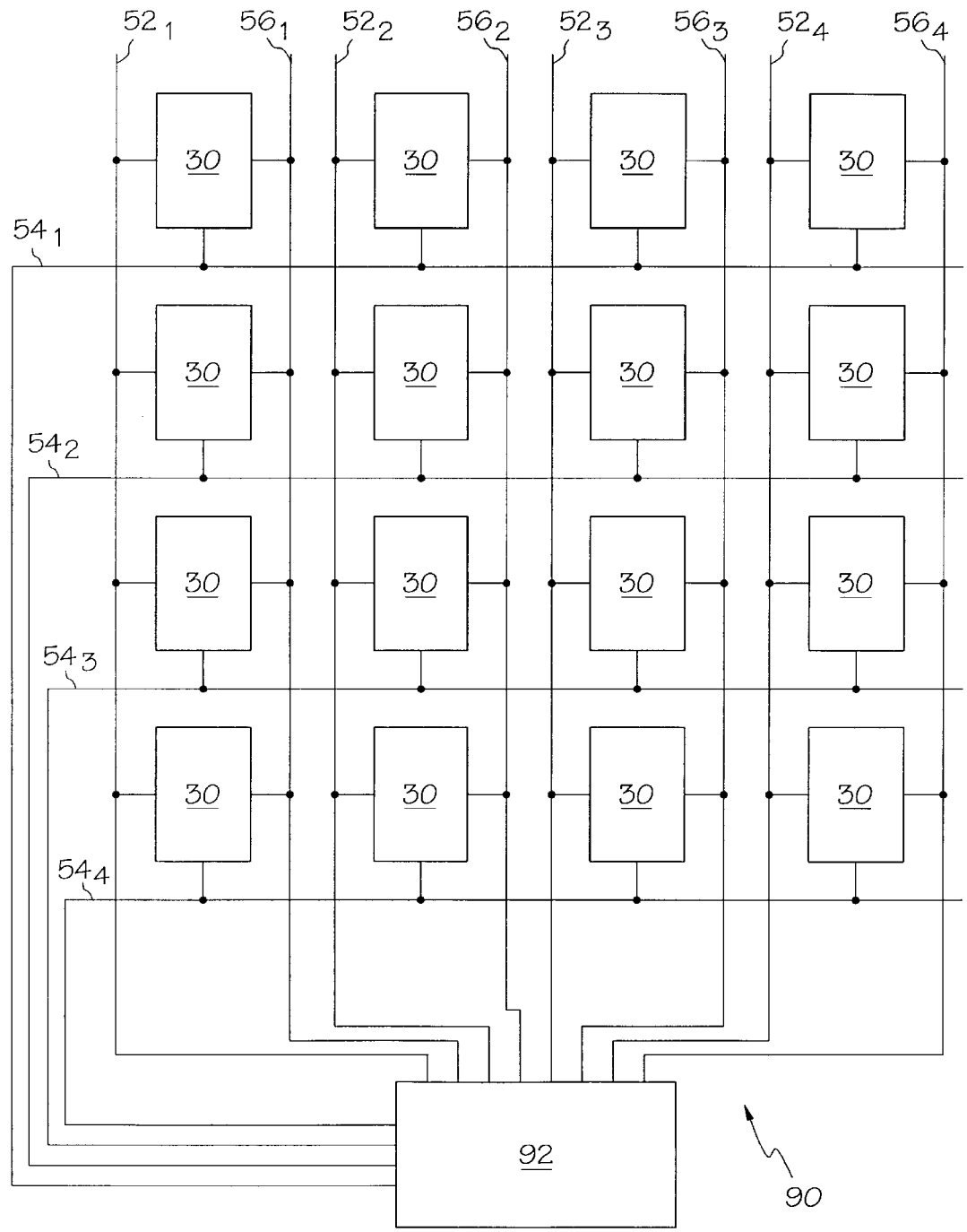
FIG. 6 illustrates schematically an SRAM memory array using the SRAM memory cell of FIG. 3.

Referring now to FIG. 6, it is contemplated by the present invention that the SRAM memory cell 30, described above with respect to FIG. 3, may be utilized to provide an SRAM memory array 90. The SRAM memory array 90 comprises a plurality of SRAM memory cells 30 arranged in a desired number of rows and columns. FIG. 6 depicts an illustrative 16 cell memory array having four (4) rows and four (4) columns. Each of the columns include respective first and second column lines $52_1-52_4$, $56_1-56_4$ while each of the rows include respective row lines $54_1-54_4$. The column and row lines $52_1-52_4$, $56_1-56_4$ and $54_1-54_4$ are coupled to a memory decoder 92. The memory decoder 92 is capable of assessing each of the memory cells 30 through a unique memory command conveyed on the column and row lines $52_1-52_4$, $56_1-56_4$ and $54_1-54_4$.

Figure 7:
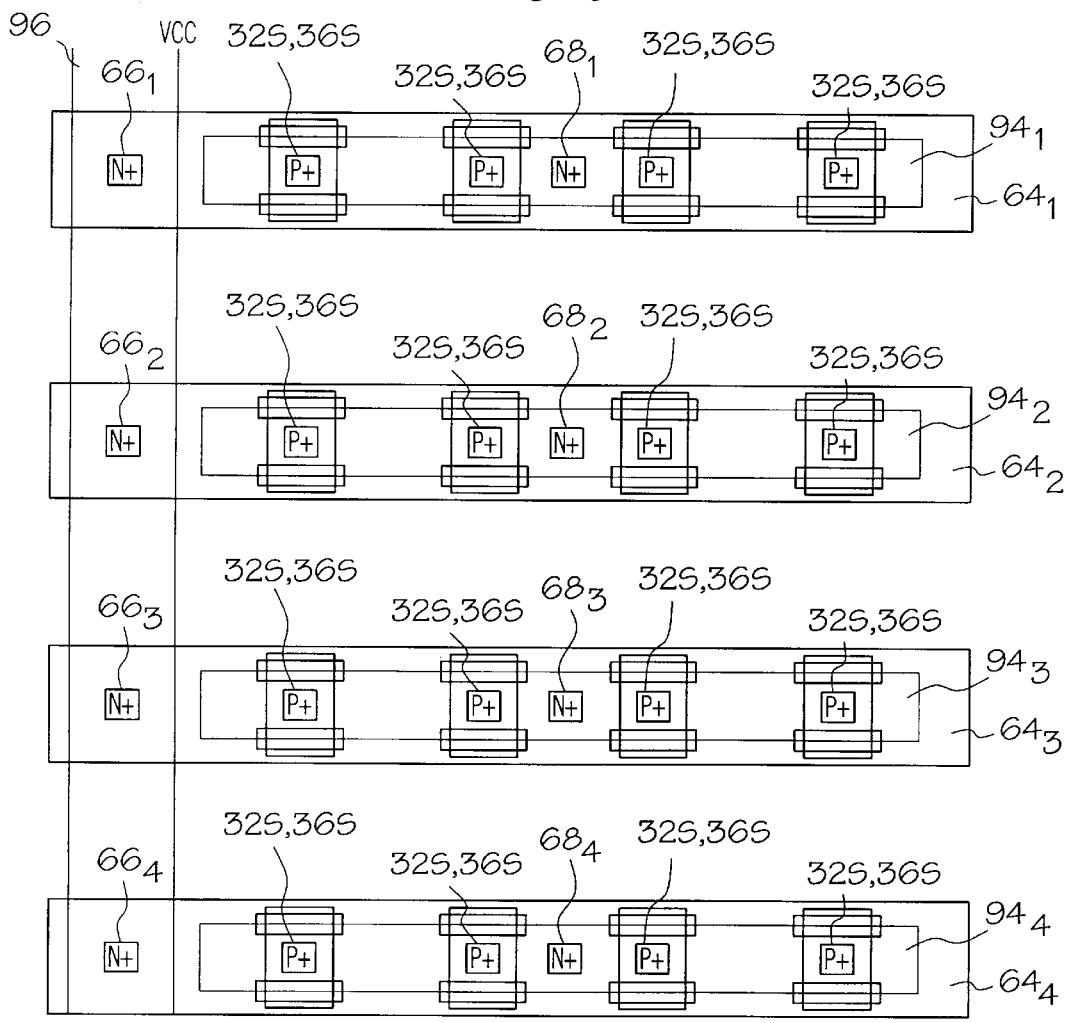
FIG. 7 is a plan view of the layout of the SRAM memory array of FIG. 6 according to another aspect of the present invention.

The first and second pull-up transistors 32 and 36 of the SRAM memory cells 30 making up each row of the memory array 90 are preferably formed within the same N-well as shown in FIG. 7. Four N-wells $64_1$–$64_4$ with each of the first and second pull-up transistors 32 and 34 for each memory cell 30 in each row sharing a respective N-well are shown in FIG. 7. For illustrative purposes, the two horizontal boxes of each cell represent the gate connections for each pull-up transistor 32, 34 while the vertical box represents the active areas for the transistors 32, 34. It will be appreciated by those skilled in the art that the first and second pull-down transistors 36, 38 for each memory cell 30 would be appropriately formed on both sides of the respective N-wells $64_1$–$64_4$.

Each of the sources 32S, 36S are coupled to respective N-well metalization lines $94_1$–$94_4$ with the N-well metalization lines $94_1$–$94_4$ being coupled to at least one $V_{cc}$ metalization line 96 receiving the first voltage input $V_{cc}$. Further, each row includes at least one contact $68_1$–$68_4$ for coupling each respective N-well $64_1$–$64_4$ to the respective N-well metalization line $94_1$–$94_4$, and hence, to the first voltage input $V_{cc}$ through the $V_{cc}$ metalization line 96. In the illustrated embodiment, there is one contact 68 for every four memory cells 30. However, it will be appreciated by those skilled in the art that this four to one ratio may be increased or decreased as appropriate for each particular application. For example, one contact 68 may be sufficient to bias the N-well 64 for every 32 memory cells 30. It will be further appreciated by those skilled in the art that additional $V_{cc}$ metalization lines 96 may be added as appropriate.

Figure 8:
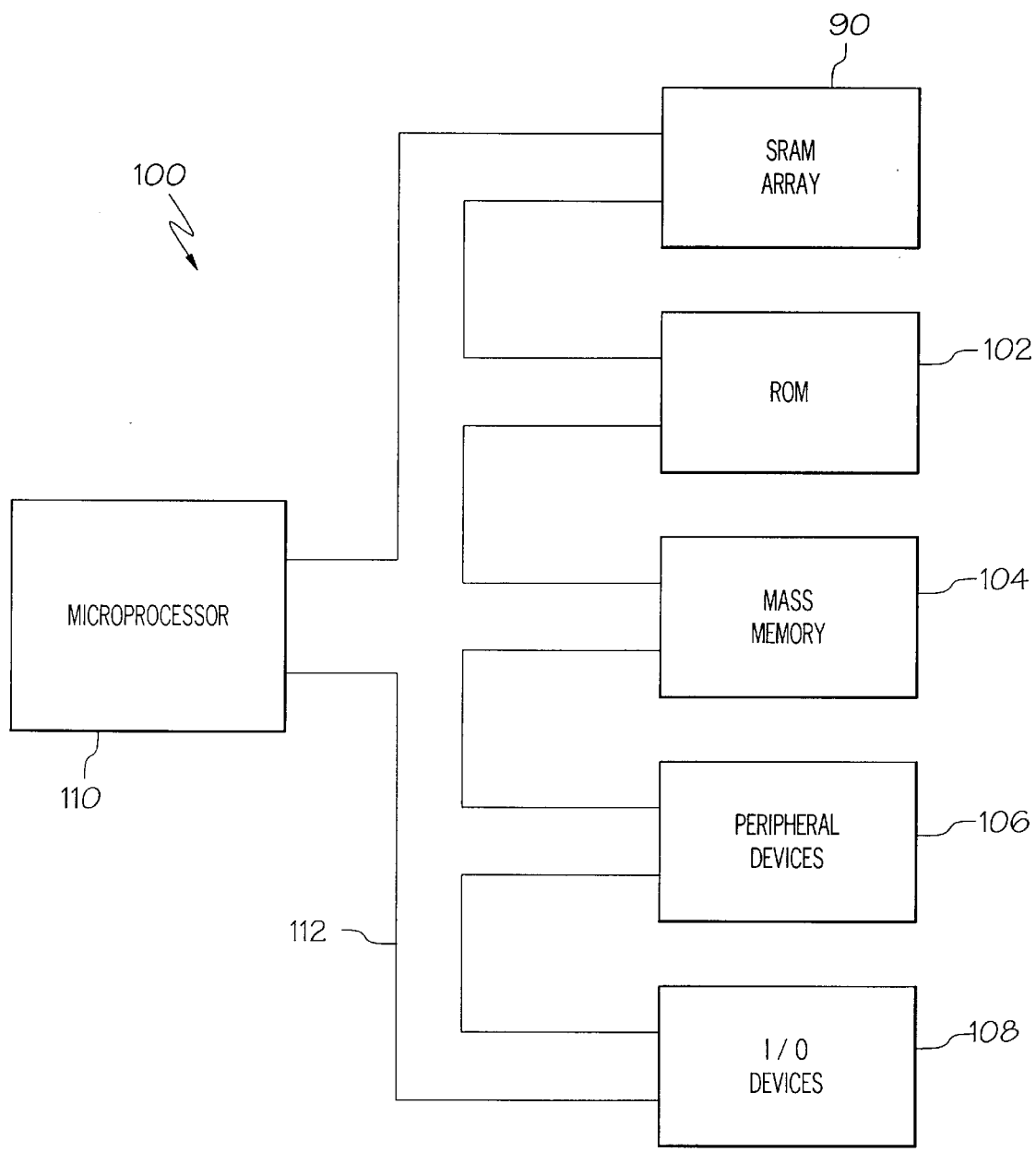
FIG. 8 illustrates schematically a computer system using the SRAM memory array of FIG. 6.
Figure 4A:
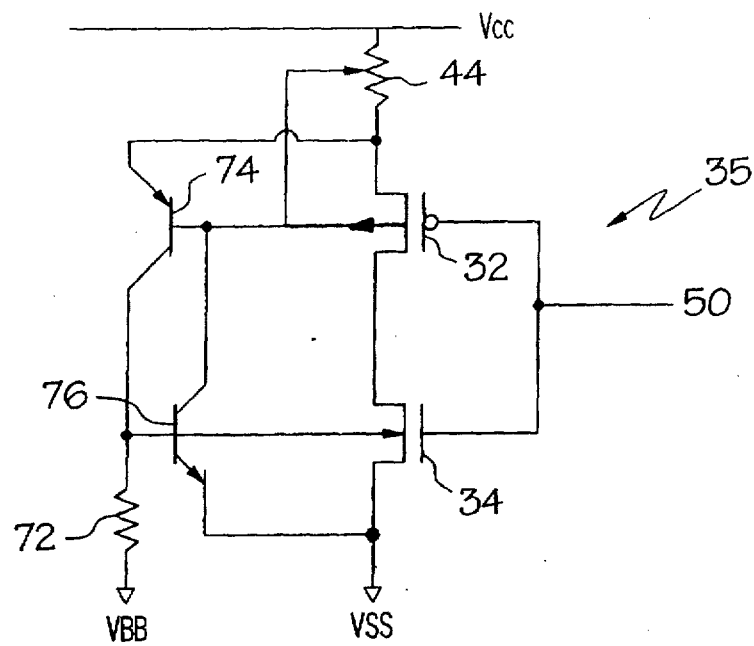

Referring now to FIG. 8, it is contemplated by the present invention that the SRAM memory array 90, described above with respect to FIG. 6, may be utilized to provide an SRAM memory array 90 within a computer system 100. As will be appreciated by those skilled in the art, the computer system 100 would include, as appropriate, a ROM 102, a mass memory 104, peripheral devices 106, and I/O devices 108 in communication with a microprocessor 110 via a data bus 112 or another suitable data communication path. The microprocessor 110 communicates with each of the plurality of memory cells 30 via the memory decoder 92.

Having described the invention in detail and by reference to preferred embodiments thereof, it will be apparent that modifications and variations are possible without departing from the scope of the invention defined in the appended claims.

What is claimed is:

1. An SRAM memory cell comprising:

a substrate assembly having at least one semiconductor layer;

a first semiconductor structure formed within said at least one semiconductor layer, said first semiconductor structure being coupled to a first voltage input through a first contact formed within said semiconductor structure;

a first pull-up transistor formed in said first semiconductor structure, said first pull-up transistor comprising a first gate, a first source and a first drain, wherein said first source is coupled to said first semiconductor structure through a second contact formed within the semiconductor structure so as to couple said first source to said first voltage input through a combined parasitic resistance of said semiconductor structure, said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first pull-up transistor is arranged such that said first drain is positioned between said first source and said second contact along a surface of said semiconductor structure such that said second component of said combined parasitic resistance is substantially less than said combined parasitic resistance; and a first pull-down transistor formed in said at least one semiconductor layer, said first pull-down transistor comprising a second gate coupled to said first gate, a second source coupled to a second voltage input, and a second drain coupled to said first drain.

2. The memory cell of claim 1, further comprising an access transistor formed in said at least one semiconductor layer having one terminal coupled to said first and second drains, another terminal coupled to a column line and an access gate coupled to a row line.

3. The memory cell of claim 1, wherein said at least one semiconductor layer comprises P-type semiconductor material, and wherein said semiconductor structure comprises an N-type well.

4. An SRAM memory cell comprising:

a substrate assembly having at least one semiconductor layer;

a first semiconductor structure and a second semiconductor structure formed within said at least one semiconductor layer, said first and second semiconductor structures being coupled to a first voltage input through respective first and third contacts formed within said first and second semiconductor structures;

a first pull-up transistor formed in said first semiconductor structure, said first pull-up transistor comprising a first gate, a first source and a first drain, wherein said first source is coupled to said first semiconductor structure through a second contact formed within said first semiconductor structure so as to couple said first source to said first voltage input through a first combined parasitic resistance of said first semiconductor structure, said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first pull-up transistor is arranged such that said first drain is positioned between said first source and said second contact along a surface of said semiconductor structure such that said second component of said combined parasitic resistance is substantially less than said combined parasitic resistance;

a first pull-down transistor formed in said at least one semiconductor layer, said first pull-down transistor comprising a second gate coupled to said first gate, a second source coupled to a second voltage input, and a second drain coupled to said first drain;

a second pull-up transistor formed in said second semiconductor structure, said second pull-up transistor comprising a third gate, a third source and a third drain, wherein said third source is coupled to said second semiconductor structure through a fourth contact formed within said second semiconductor structure so as to couple said third source to said first voltage input through a second combined parasitic resistance of said second semiconductor structure, said third source of said second pull-up transistor, said second semiconductor structure, and said semiconductor layer are further configured to form an additional first parasitic bi-polar transistor including a base, said base of said additional bi-polar transistor is coupled to said fourth contact through a first component of said second combined parasitic resistance and to said third contact through a second component of said second combined parasitic resistance, and said second pull-up transistor is arranged such that said third drain is positioned between said third source and said fourth contact along a surface of said second semiconductor structure such that said second component of said second combined parasitic resistance is substantially less than said second combined parasitic resistance; and a second pull-down transistor formed in said at least one semiconductor layer, said second pull-down transistor comprising a fourth gate coupled to said third gate, a fourth source coupled to said second voltage input, and a fourth drain coupled to said third drain.

5. The memory cell of claim 4, wherein said at least one semiconductor layer comprises P-type semiconductor material, and wherein said first and second semiconductor structures each comprise an N-type well.

6. The memory cell of claim 4, wherein said first semiconductor structure and said second semiconductor structure form portions of a single semiconductor structure.

7. The memory cell of claim 6, wherein said at least one semiconductor layer comprises P-type semiconductor material, and wherein said first semiconductor structure comprises an N-type well.

8. The memory cell of claim 8, further comprising:
a first access transistor formed in said at least one semiconductor layer having a first terminal coupled to said first and second drains, a second terminal coupled to a first column line and a first access gate coupled to a row line; and
a second access transistor formed in said at least one semiconductor layer having a third terminal coupled to said third and fourth drains, a fourth terminal coupled to a second column line and a second access gate coupled to said row line.

9. An SRAM memory array comprising:
a plurality of SRAM memory cells arranged in rows and columns and formed on a substrate assembly comprising at least one semiconductor layer, each of said plurality of memory cells comprising:
a first semiconductor structure and a second semiconductor structure formed within said at least one semiconductor layer, said first and second semiconductor structures being coupled to a first voltage input through respective first and third contacts formed within said first and second semiconductor structures;
a first pull-up transistor formed in said first semiconductor structure, said first pull-up transistor comprising a first gate, a first source and a first drain, wherein said first source is coupled to said first semiconductor structure through a second contact formed within said first semiconductor structure so as to couple said first source to said first voltage input through a first combined parasitic resistance of said first semiconductor structure, said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first pull-up transistor is arranged such that said first drain is positioned between said first source and said second contact along a surface of said semiconductor structure such that said second component of said combined parasitic resistance is substantially less than said combined parasitic resistance;

a first pull-down transistor formed in said at least one semiconductor layer, said first pull-down transistor comprising a second gate coupled to said first gate, a second source coupled to a second voltage input, and a second drain coupled to said first drain;

a second pull-up transistor formed in said second semiconductor structure, said second pull-up transistor comprising a third gate, a third source and a third drain, wherein
said third source is coupled to said second semiconductor structure through a fourth contact formed within said second semiconductor structure so as to couple said third source to said first voltage input through a second combined parasitic resistance of said second semiconductor structure, said third source of said second pull-up transistor, said second semiconductor structure, and said semiconductor layer are further configured to form an additional first parasitic bi-polar transistor including a base, said base of said additional bi-polar transistor is coupled to said fourth contact through a first component of said second combined parasitic resistance and to said third contact through a second component of said second combined parasitic resistance, and said second pull-up transistor is arranged such that said third drain is positioned between said third source and said fourth contact along a surface of said second semiconductor structure such that said second component of said second combined parasitic resistance is substantially less than said second combined parasitic resistance;

a second pull-down transistor formed in said at least one semiconductor layer, said second pull-down transistor comprising a fourth gate coupled to said third gate, a fourth source coupled to said second voltage input, and a fourth drain coupled to said third drain;

a first access transistor formed in said at least one semiconductor layer having a first terminal coupled to said first and second drains, a second terminal coupled to a first column line and a first access gate coupled to a row line;

a second access transistor formed in said at least one semiconductor layer having a third terminal coupled to said third and fourth drains, a fourth terminal coupled to a second column line and a first access gate coupled to a row line; and a memory decoder coupled to said plurality of memory cells for accessing each of said plurality of memory cells via respective ones of a plurality of said row lines and respective ones of a plurality of said first and second column lines.

10. The memory array of claim 9, wherein said first semiconductor structure and said second semiconductor structure form portions of a single substrate.

11. The memory array of claim 10, wherein said at least one semiconductor layer comprises P-type semiconductor material, and wherein said first semiconductor structure comprises an N-type well.

12. The memory array of claim 11, wherein said memory array comprises a plurality of said rows, and wherein each of said first and second pull-up transistors making up each of said rows of memory cells share said N-type well.

13. A computer system comprising:
   a memory array formed on a substrate assembly comprising at least one semiconductor layer, said memory array comprising:
      a plurality of memory cells arranged in rows and columns, each of said
         a first semiconductor structure and a second semiconductor structure formed within said at least one semiconductor layer, said first and second semiconductor structures being coupled to a first voltage input through respective first and third contacts formed within said first and second semiconductor structures;
         a first pull-up transistor formed in said first semiconductor structure, said first pull-up transistor comprising a first gate, a first source and a first drain, wherein
            said first source is coupled to said first semiconductor structure through a second contact formed within said first semiconductor structure so as to couple said first source to said first voltage input through a first combined parasitic resistance of said first semiconductor structure,
            said first source of said first pull-up transistor, said first semiconductor structure, and said semiconductor layer are further configured to form a first parasitic bi-polar transistor including a base,
            said base of said first bipolar transistor is coupled to said second contact through a first component of said combined parasitic resistance and to said first contact through a second component of said combined parasitic resistance, and
            said first pull-up transistor is arranged such that said first drain is positioned between said first source and said second contact along a surface of said semiconductor structure such that said second component of said combined parasitic resistance is substantially less than said combined parasitic resistance;
         a first pull-down transistor formed in said at least one semiconductor layer, said first pull-down transistor comprising a second gate coupled to said first gate, a second source coupled to a second voltage input, and a second drain coupled to said first drain;
         a second pull-up transistor formed in said second semiconductor structure, said second pull-up transistor comprising a third gate, a third source and a third drain, wherein
            said third source is coupled to said second semiconductor structure through a fourth contact formed within said second semiconductor structure so as to couple said third source to said first voltage input through a second combined parasitic resistance of said second semiconductor structure,
            said third source of said second pull-up transistor, said second semiconductor structure, and said semiconductor layer are further configured to form an additional first parasitic bi-polar transistor including a base,
            said base of said additional bi-polar transistor is coupled to said fourth contact through a first component of said second combined parasitic resistance and to said third contact through a second component of said second combined parasitic resistance, and
            said second pull-up transistor is arranged such that said third drain is positioned between said third source and said fourth contact along a surface of said second semiconductor structure such that said second component of said second combined parasitic resistance is substantially less than said second combined parasitic resistance;
         a second pull-down transistor formed in said at least one semiconductor layer, said second pull-down transistor comprising a fourth gate coupled to said third gate, a fourth source coupled to said second voltage input, and a fourth drain coupled to said third drain;
         a first access transistor formed in said at least one semiconductor layer having a first terminal coupled to said first and second drains, a second terminal coupled to a first column line and a first access gate coupled to a row line;
         a second access transistor formed in said at least one semiconductor layer having a third terminal coupled to said third and fourth drains, a fourth terminal coupled to a second column line and a first access gate coupled to a row line; and
   a memory decoder coupled to said plurality of memory cells for accessing each of said plurality of memory cells via said respective ones of a plurality of said row lines and respective ones of a plurality of said first and second column lines; and
   a microprocessor in communication with each of said plurality of memory cells via said memory decoder.

14. An SRAM memory cell comprising:
   a substrate assembly having at least one semiconductor layer;
   a first semiconductor structure formed within said at least one semiconductor layer, said first semiconductor structure being coupled to a first voltage input through a first contact formed within said semiconductor structure;
   a first pull-up transistor formed in said first semiconductor structure, said first pull-up transistor comprising a first gate, a first source and a first drain, wherein
      said first source is coupled to said first semiconductor structure through a second contact formed within the semiconductor structure so as to couple said first source to said first voltage input through a combined parasitic resistance of said semiconductor structure,
      said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first drain, said first source, said first contact, and said second contact are arranged such that said first component of said combined parasitic resistance is at least as large as said second component of said combined parasitic resistance; and a first pull-down transistor formed in said at least one semiconductor layer, said first pull-down transistor comprising a second gate coupled to said first gate, a second source coupled to a second voltage input, and a second drain coupled to said first drain.

15. An SRAM memory cell as claimed in claim 14 wherein said first drain, said first source, said first contact, and said second contact are arranged such that said first component of said combined parasitic resistance is larger than said second component of said combined parasitic resistance.

16. An SRAM memory cell comprising:

a substrate assembly having at least one semiconductor layer;

a first semiconductor structure and a second semiconductor structure formed within said at least one semiconductor layer, said first and second semiconductor structures being coupled to a first voltage input through respective first and third contacts formed within said first and second semiconductor structures;

a first pull-up transistor formed in said first semiconductor structure, said first pull-up transistor comprising a first gate, a first source and a first drain, wherein said first source is coupled to said first semiconductor structure through a second contact formed within said first semiconductor structure so as to couple said first source to said first voltage input through a first combined parasitic resistance of said first semiconductor structure, said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first drain, said first source, said first contact, and said second contact are arranged such that said first component of said combined parasitic resistance is at least as large as said second component of said combined parasitic resistance;

a first pull-down transistor formed in said at least one semiconductor layer, said first pull-down transistor comprising a second gate coupled to said first gate, a second source coupled to a second voltage input, and a second drain coupled to said first drain;

a second pull-up transistor formed in said second semiconductor structure, said second pull-up transistor comprising a third gate, a third source and a third drain, wherein said third source is coupled to said second semiconductor structure through a fourth contact formed within said second semiconductor structure so as to couple said third source to said first voltage input through a second combined parasitic resistance of said second semiconductor structure, said third source of said second pull-up transistor, said second semiconductor structure, and said semiconductor layer are further configured to form an additional first parasitic bi-polar transistor including a base, said base of said additional bi-polar transistor is coupled to said fourth contact through a first component of said second combined parasitic resistance and to said third contact through a second component of said second combined parasitic resistance, and said third drain, said third source, said third contact, and said fourth contact are arranged such that said first component of said additional combined parasitic resistance is at least as large as said second component of said additional combined parasitic resistance; and a second pull-down transistor formed in said at least one semiconductor layer, said second pull-down transistor comprising a fourth gate coupled to said third gate, a fourth source coupled to said second voltage input, and a fourth drain coupled to said third drain.

17. An SRAM memory cell as claimed in claim 16 wherein:

said first drain, said first source, said first contact, and said second contact are arranged such that said first component of said combined parasitic resistance is larger than said second component of said combined parasitic resistance; and said third drain, said third source, said third contact, and said fourth contact are arranged such that said first component of said additional combined parasitic resistance is larger than said second component of said additional combined parasitic resistance.

18. An SRAM memory array comprising:

a plurality of SRAM memory cells arranged in rows and columns and formed on a substrate assembly comprising at least one semiconductor layer, each of said plurality of memory cells comprising:

a first semiconductor structure and a second semiconductor structure formed within said at least one semiconductor layer, said first and second semiconductor structures being coupled to a first voltage input through respective first and third contacts formed within said first and second semiconductor structures;

a first pull-up transistor formed in said first semiconductor structure, said first pull-up transistor comprising a first gate, a first source and a first drain, wherein said first source is coupled to said first semiconductor structure through a second contact formed within said first semiconductor structure so as to couple said first source to said first voltage input through a first combined parasitic resistance of said first semiconductor structure, said first source of said first pull-up transistor, said first semiconductor structure, and said semiconductor layer are further configured to form a first parasitic bi-polar transistor including a base, said base of said first bi-polar transistor is coupled to said second contact through a first component of said combined parasitic resistance and to said first contact through a second component of said combined parasitic resistance, and said first drain, said first source, said first contact, and said second contact are arranged such that said first component of said combined parasitic resistance is at least as large as said second component of said combined parasitic resistance;
a first pull-down transistor formed in said at least one semiconductor layer, said first pull-down transistor comprising a second gate coupled to said first gate, a second source coupled to a second voltage input, and a second drain coupled to said first drain;
a second pull-up transistor formed in said second semiconductor structure, said second pull-up transistor comprising a third gate, a third source and a third drain, wherein
said third source is coupled to said second semiconductor structure through a fourth contact formed within said second semiconductor structure so as to couple said third source to said first voltage input through a second combined parasitic resistance of said second semiconductor structure,
said third source of said second pull-up transistor, said second semiconductor structure, and said semiconductor layer are further configured to form an additional first parasitic bi-polar transistor including a base,
said base of said additional bi-polar transistor is coupled to said fourth contact through a first component of said second combined parasitic resistance and to said third contact through a second component of said second combined parasitic resistance, and
said third drain, said third source, said third contact, and said fourth contact are arranged such that said first component of said additional combined parasitic resistance is at least as large as said second component of said additional combined parasitic resistance;
a second pull-down transistor formed in said at least one semiconductor layer, said second pull-down transistor comprising a fourth gate coupled to said third gate, a fourth source coupled to said second voltage input, and a fourth drain coupled to said third drain;
a first access transistor formed in said at least one semiconductor layer having a first terminal coupled to said first and second drains, a second terminal coupled to a first column line and a first access gate coupled to a row line;
a second access transistor formed in said at least one semiconductor layer having a third terminal coupled to said third and fourth drains, a fourth terminal coupled to a second column line and a first access gate coupled to a row line; and
a memory decoder coupled to said plurality of memory cells for accessing each of said plurality of memory cells via respective ones of a plurality of said row lines and respective ones of a plurality of said first and second column lines.

19. An SRAM memory array as claimed in claim 18 wherein:
said first drain, said first source, said first contact, and said second contact are arranged such that said first component of said combined parasitic resistance is larger than said second component of said combined parasitic resistance; and
said third drain, said third source, said third contact, and said fourth contact are arranged such that said first component of said additional combined parasitic resistance is larger than said second component of said additional combined parasitic resistance.

20. A computer system comprising:
a memory array formed on a substrate assembly comprising at least one semiconductor layer, said memory array comprising:
a plurality of memory cells arranged in rows and columns, each of said memory cells comprising:
a first semiconductor structure and a second semiconductor structure formed within said at least one semiconductor layer, said first and second semiconductor structures being coupled to a first voltage input through respective first and third contacts formed within said first and second semiconductor structures;
a first pull-up transistor formed in said first semiconductor structure, said first pull-up transistor comprising a first gate, a first source and a first drain, wherein
said first source is coupled to said first semiconductor structure through a second contact formed within said first semiconductor structure so as to couple said first source to said first voltage input through a first combined parasitic resistance of said first semiconductor structure,
said first source of said first pull-up transistor, said first semiconductor structure, and said semiconductor layer are further configured to form a first parasitic bi-polar transistor including a base,
said base of said first bi-polar transistor is coupled to said second contact through a first component of said combined parasitic resistance and to said first contact through a second component of said combined parasitic resistance, and
said first drain, said first source, said first contact, and said second contact are arranged such that said first component of said combined parasitic resistance is at least as large as said second component of said combined parasitic resistance;
a first pull-down transistor formed in said at least one semiconductor layer, said first pull-down transistor comprising a second gate coupled to said first gate, a second source coupled to a second voltage input, and a second drain coupled to said first drain;
a second pull-up transistor formed in said second semiconductor structure, said second pull-up transistor comprising a third gate, a third source and a third drain, wherein
said third source is coupled to said second semiconductor structure through a fourth contact formed within said second semiconductor structure so as to couple said third source to said first voltage input through a second combined parasitic resistance of said second semiconductor structure,
said third source of said second pull-up transistor, said second semiconductor structure, and said semiconductor layer are further configured to form an additional first parasitic bi-polar transistor including a base,
said base of said additional bi-polar transistor is coupled to said fourth contact through a first component of said second combined parasitic resistance and to said third contact through a second component of said second combined parasitic resistance, and said third drain, said third source, said third contact, and said fourth contact are arranged such that said first component of said additional combined parasitic resistance is at least as large as said second component of said additional combined parasitic resistance;

a second pull-down transistor formed in said at least one semiconductor layer, said second pull-down transistor comprising a fourth gate coupled to said third gate, a fourth source coupled to said second voltage input, and a fourth drain coupled to said third drain;

a first access transistor formed in said at least one semiconductor layer having a first terminal coupled to said first and second drains, a second terminal coupled to a first column line and a first access gate coupled to a row line;

a second access transistor formed in said at least one semiconductor layer having a third terminal coupled to said third and fourth drains, a fourth terminal coupled to a second column line and a first access gate coupled to a row line; and a memory decoder coupled to said plurality of memory cells for accessing each of said plurality of memory cells via said respective ones of a plurality of said row lines and respective ones of a plurality of said first and second column lines; and a microprocessor in communication with each of said plurality of memory cells via said memory decoder.

21. A computer system as claimed in claim 18 wherein:

said first drain, said first source, said first contact, and said second contact are arranged such that said first component of said combined parasitic resistance is larger than said second component of said combined parasitic resistance; and said third drain, said third source, said third contact, and said fourth contact are arranged such that said first component of said additional combined parasitic resistance is larger than said second component of said additional combined parasitic resistance.

* * * * *

UNITED STATES PATENT AND TRADEMARK OFFICE
CERTIFICATE OF CORRECTION

PATENT NO : 6,005,797
DATED : December 21, 1999
INVENTOR(S) : John D. Porter; William N. Thompson It is certified that error appears in the above-identified patent and that said Letters Patent is hereby corrected as shown below:

Claim 8, Col. 15, line 38, "The memory cell of Claim 8," should read -- The memory cell of Claim 4, --.

Claim 13, Col. 17, line 20, "each of said a first" should read -- each of said memory cells comprising: a first --.

Signed and Sealed this

Fourteenth Day of November, 2000

Q. TODD DICKINSON

*Attest:*

*Attesting Officer*　　　*Director of Patents and Trademarks*

UNITED STATES PATENT AND TRADEMARK OFFICE
CERTIFICATE OF CORRECTION

PATENT NO.   : 6,005,797  
DATED        : December 21, 1999  
INVENTOR(S)  : John D. Porter and William N. Thompson Page 1 of 2

It is certified that error appears in the above-identified patent and that said Letters Patent is hereby corrected as shown below:

Drawings,
Delete sheet 3 and substitute the attached sheet as shown on the attached page.

Signed and Sealed this

Twenty-eighth Day of May, 2002

Attest:

JAMES E. ROGAN  
*Attesting Officer*   *Director of the United States Patent and Trademark Office*